United States Patent
Kahl et al.

(10) Patent No.: US 6,547,252 B1
(45) Date of Patent: Apr. 15, 2003

(54) HOUSING HAVING A RECESS FOR LOCATING PART OF A SEALING MATERIAL

(76) Inventors: Helmut Kahl, Horstwalder Strasse 23, D-12307 Berlin (DE); Bernd Tiburtius, Rosenhag 10, D-14532 Kleinmachnow (DE)

( * ) Notice: Subject to any disclaimer, the term of this patent is extended or adjusted under 35 U.S.C. 154(b) by 0 days.

(21) Appl. No.: 09/582,810

(22) PCT Filed: Oct. 24, 1998

(86) PCT No.: PCT/DE98/03167

§ 371 (c)(1),
(2), (4) Date: Jun. 30, 2000

(87) PCT Pub. No.: WO99/40769

PCT Pub. Date: Aug. 12, 1999

(30) Foreign Application Priority Data

Feb. 9, 1998 (DE) .......................................... 198 04 861

(51) Int. Cl.⁷ ................................................ F16J 15/14
(52) U.S. Cl. ..................................................... 277/590
(58) Field of Search ................................ 277/312, 316, 277/920, 628, 639, 641, 642, 650, 904, 906; 174/35 GC

(56) References Cited

U.S. PATENT DOCUMENTS

| 3,469,015 A | * | 9/1969 | Warren |
| 4,825,015 A | * | 4/1989 | Prott et al. |
| 4,841,102 A | * | 6/1989 | Elsner et al. .......... 174/35 GC |
| 4,931,479 A | * | 6/1990 | Morgan |
| 5,513,996 A | * | 5/1996 | Annerino et al. ...... 174/35 GC |
| 5,641,438 A | | 6/1997 | Bunyan et al. |
| 5,847,317 A | * | 12/1998 | Phelps |
| 5,882,729 A | | 3/1999 | Kahl et al. |
| 6,096,413 A | * | 8/2000 | Kalinoski et al. ...... 174/35 GC |
| 6,222,122 B1 | * | 4/2001 | Davidson |
| 6,224,058 B1 | * | 5/2001 | Drebing et al. |
| 6,239,359 B1 | * | 5/2001 | Lilienthal, II et al. |

FOREIGN PATENT DOCUMENTS

| DE | 43 19 965 | 12/1994 |
| WO | WO 98/06246 | 2/1998 |

* cited by examiner

Primary Examiner—Anthony Knight
Assistant Examiner—William D Hutton, Jr.
(74) Attorney, Agent, or Firm—Christie, Parker & Hale, LLP

(57) ABSTRACT

A housing (3), especially for the electromagnetically shielded location of electronic components, with a first and second housing part (1, 2) and a sealing profile (8) arranged between the first and second housing parts and sealing off the inner space of the housing, made of an elastically hardened sealing material (7) consisting of the substance applied in an initial pasty state or foamed from an initial liquid state and tightly adhered to the housing, whereby the first housing part has a defined receiving area (9), especially a recess, for the locating of a part of the sealing material applied thereto in the area of an initial, final or bifurcation point of the sealing profile embodied with a raised cross section in relation to the rest of the longitudinal extension of the sealing profile.

14 Claims, 7 Drawing Sheets

HOUSING HAVING A RECESS FOR LOCATING PART OF A SEALING MATERIAL

BACKGROUND OF THE INVENTION

The invention relates to a housing according to the generic portion of claim 1.

Such a housing is known from DE 43 19 965 C2.

Housings of this type have been produced primarily from plastic for reasons of price and weight since the beginning of the extensive spread of mobile telephones or cordless telephones. The prefabricated, especially extruded, housing parts are coated with a conductive material to produce an electromagnetic shielding effect, possibly by spraying with conductive paint, deposition of aluminum, or galvanization. Then, a likewise shielding seal is dispensed thereon, and after insertion of the electronic function groups, the housing parts are connected to each other, usually screwed.

The shielding seal consists of an electrically conductive, elastic material and must be executed in its geometric dimensions and mechanical properties such that it adapts to surface tolerances and unevenness, such that even with the tolerances present in mass production, a very high quality of shielding of the interior of the housing is guaranteed.

Especially the beginnings, ends, and bifurcations of the seals cause problems because of the addition of system tolerances. These result from tolerances of the part (production tolerances with milling, descaling, or other tensioning or forming processes) as well as from the effect of subsequent processing (production of galvanic, mechanically applied or sprayed coatings) or other effects, such as from pressure, irradiation, heat, chemical solvents or wetting agents, etc. The production of the sealing profile with a defined height with a relatively lower tolerance is all the more critical the more miniaturized the system is. Even the achieving of adequate adherence (shear stability) is increasingly difficult in light of the addition of the tolerances and disturbing influences in miniaturized systems.

This becomes clear from the following: The dispensing element (e.g., a hollow needle) should be guided at a defined small distance (e.g., 0.6 mm) above the surface of housing part. The distance changes by 16% per 0.1 mm dimensional deviation of the housing part. Accordingly, more dispensed material would have to be applied on the surface in order to obtain a constant height of the housing part-sealing profile part system. This could be realized using an expensive measurement and control apparatus; however, such a solution is both technically and temporally impracticable in mass production.

The problems are intensified in so-called multiple-head systems with a plurality of dispensing elements which operate in parallel in a plurality of nests which have tolerance-based reaction times and must operate in coordination with each other.

Consequently, in the prior art, the system operates with an excess of material, whereby a surplus of material is applied especially at the initial, final, or connecting and bifurcation points. The sealing profiles thus produced must frequently be retouched in labor-intensive and, consequently, more expensive processes.

SUMMARY OF THE INVENTION

The object of the invention is, therefore, to provide a housing of the type mentioned which can be produced more simply and economically while meeting the tolerance specifications customary in mass production.

The object is accomplished by a housing with the characteristics of claim 1.

The invention includes the technical teaching of providing, on the housing, as an integrated component of the sealing system, a receiving area for a safety-excess of the sealing material. This enables an increase in the admissible tolerances of the housing parts as well as the control of the dispenser heads and/or the elimination of any retouching of the hardened sealing profile.

The invention provides special cost advantages when the first and/or second housing part is a cast or extruded part, especially made of plastic with the large tolerances customary therewith—above all when the recess serving as a receiving area is already formed in the first housing part at the time of casting or extrusion.

This receiving area may—depending on the actual housing specification—be arranged both in alignment with the longitudinal extension of the sealing profile and laterally offset relative thereto. It can be open on the side or closed all the way around (e.g., an open or closed hole). In the receiving area, the sealing "bead" runs in certain applications preferably at angle to the direction of the further extension of the profile.

In advantageous embodiments, an incline or an edge is provided on the recess in order to achieve improved grip of the strand of sealing material with the recess during application (possibly a type of interlocking) and to counteract a possible "slip off" of the initial point which may occur with certain housing-seal-material pairs or with a contaminated surface.

Moreover, the recess can be formed in connection with an opening provided for the location of a connection means to connect the first and second housing parts. This configuration can also be used advantageously for an additional seal in this area.

In an additional advantageous embodiment, the recess is directly adjacent to an incompressible spacer on the surface of the first housing part protruding toward the second housing part. This is expediently formed during primary forming of the housing part from the housing material.

Currently considered the most important practical embodiment is that with an EMI-shielding and sealing profile which has an electrically conductive sealing material and with housing parts made of plastic with substantially all-over conductive coating of the surface which is in contact with the sealing profile. The invention is, however, not restricted to such shielding housings but may advantageously also be applied in dust- or watertight housings.

Advantageous improvements of the invention are also characterized in the subordinate claims or are presented in greater detail in the following along with the description of preferred embodiments with reference to the figures. They depict:

DETAILED DESCRIPTION OF THE PREFERRED EMBODIMENTS

Figure 1:
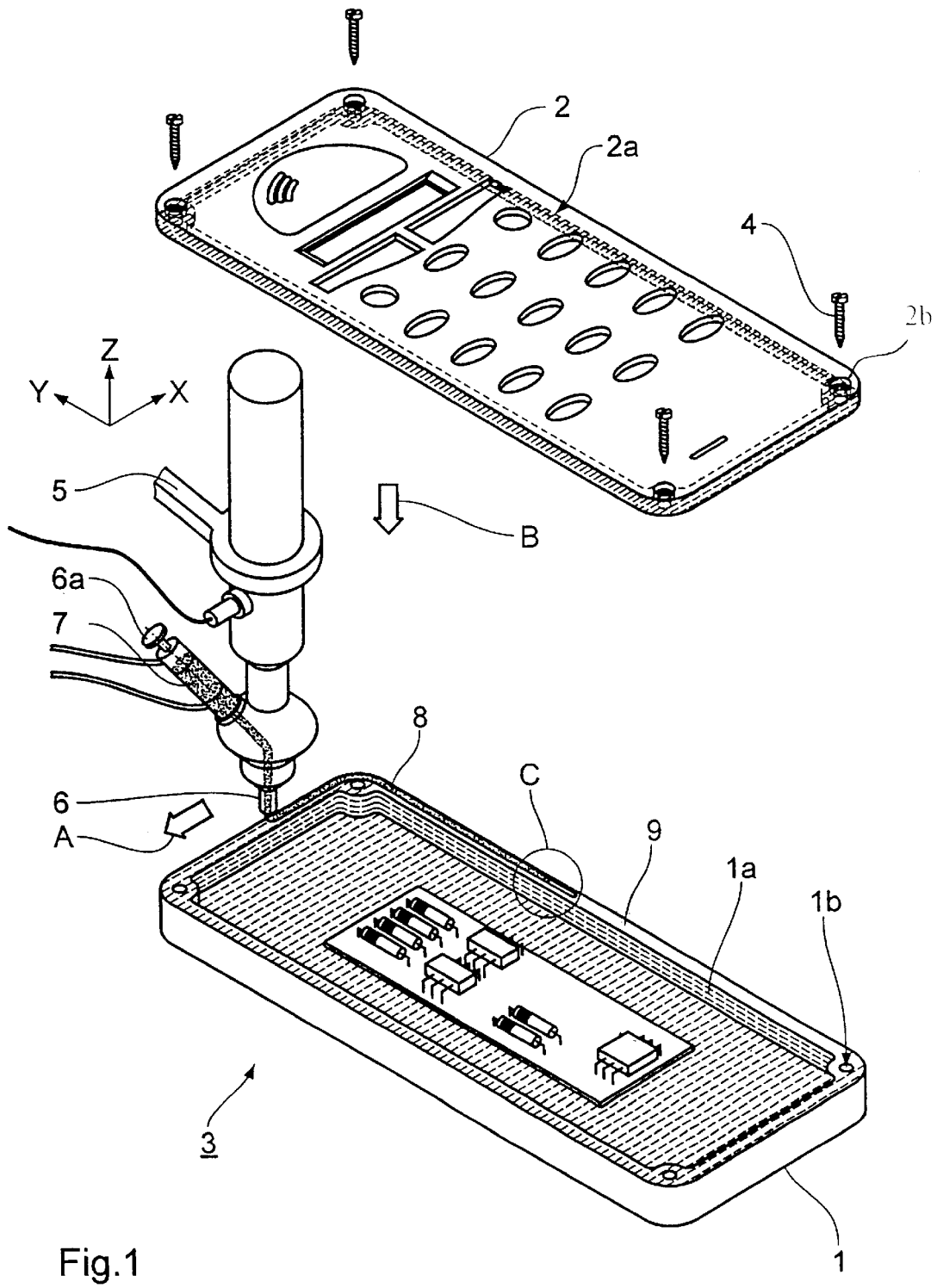
FIG. 1 a principal sketch for the embodiment of the invention.

FIG. 1 depicts schematically a bottom housing part 1 and a top housing part 2 of a mobile phone housing 3 made of extruded plastic, both of which are provided with an inside metalizing layer 1a and 2a, respectively. Screw holes 1b and 2b, respectively, are formed in both housing parts 1, 2, whereby the screw holes 1b in the bottom housing part are designed for partial self-tapping insertion of self-tapping screws 4.

In the figure, it is sketched how an arm 5 of a coordinate-controlled handling apparatus (not completely shown) guides an application needle 6 with a hose connection 6a to deliver a pressurized conductive seal starting material 7 in the direction of the arrow A over the edge section of the bottom housing part 1. Thus, a sealing and shielding material strand 8 is dispensed onto the edge section and adheres tightly there upon hardening. After the hardening is at least substantially completed, the top part 2 is placed on the bottom part 1—as symbolized by the arrow B—and screwed to it by means of the screws 6, whereby the strand solidified into the sealing and shielding profile 8 is elastically deformed without adhesion on the top part 2 and reliably seals and electromagnetically shields the gap between the housing parts 1, 2.

Figure 1A:
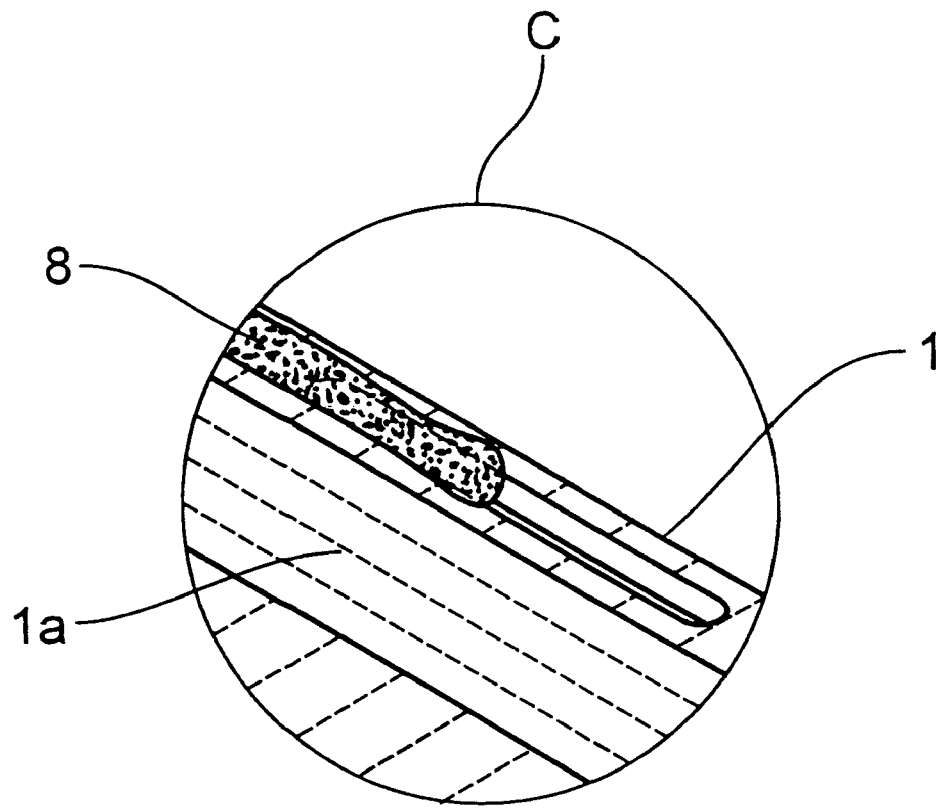
FIG. 1a a detail from FIG. 1.

A recess 9 in the form of an elongated hole, which is better discernible in the enlarged depiction of the section C in FIG. 1a, is incorporated in the section C of the edge area of the bottom housing 3 part 1. The elongated hole 9 defines the initial and also the final point of the application of the shielding profile 8, where, to ensure a reliable all-around seal, in each case an increased amount of material is discharged from the application needle 6 and partially received in the elongated hole.

Figure 2A:
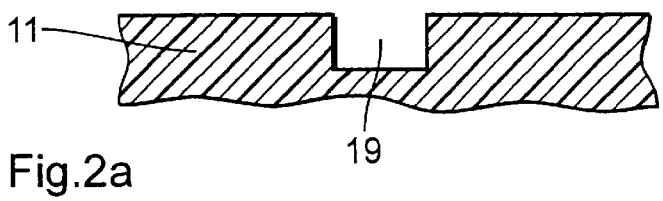
FIGS. 2a through 2f schematic depictions of different examples of housing sections with recesses in longitudinal section or in top view, FIGS. 3a through 3i schematic depictions of three improved embodiments, each in a top view and in a cross-sectional depiction of a housing section as well as in the state with the double strand of sealing material applied, and FIGS. 4a and 4b schematic depictions of two additional embodiments of the invention.
Figure 2B:
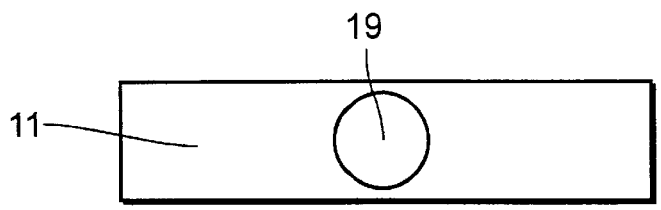
Figure 2C:
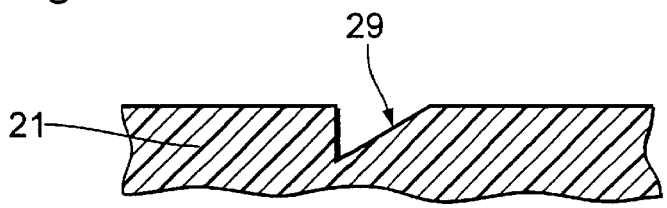
Figure 2D:
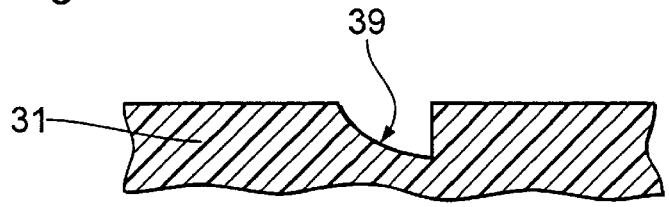
Figure 2E:
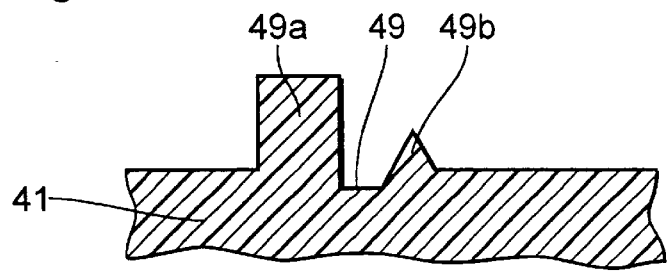
Figure 2F:
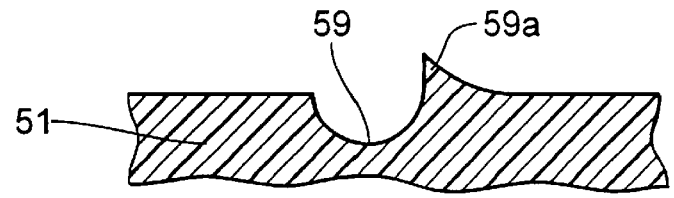

FIGS. 2a through 2f depict schematically examples of housing sections of housing parts 11, 21, 31, 41, and 51, respectively, with recesses 19, 29, 39, 49, and 59, respectively, provided as initial areas in longitudinal cross-section (FIGS. 2a and 2c through 2e) or in a top view (FIG. 2b as a top view of FIG. 2a). As can be discerned here, the recess can be implemented depending on the actual technological edge conditions as a simple blind hole with a bottom parallel to the surface of the housing part (FIGS. 2a and 2b) or also as an opening with a circular cross-section, but inclined in different directions or even a curved bottom (FIGS. 2c or 2d, respectively). Moreover, one or a plurality of projections can be associated with it on the housing surface, such as the spacer 49a associated with the initial zone 49 in FIG. 2e and the incline 49b or the retaining hip 59a associated with a semicircular trough 59 in the housing part 51. Besides the function of a spacer and limiter of the so-called compression set (also see in this regard the following embodiments), such projections have the function of improving adhesion especially at the initial point of a sealing material strand, especially with problematic surface conditions and/or housing-seal material pairings. Even a sharp edged embodiment of the edge of the recess itself can serve this purpose to certain extent.

Figure 3A:
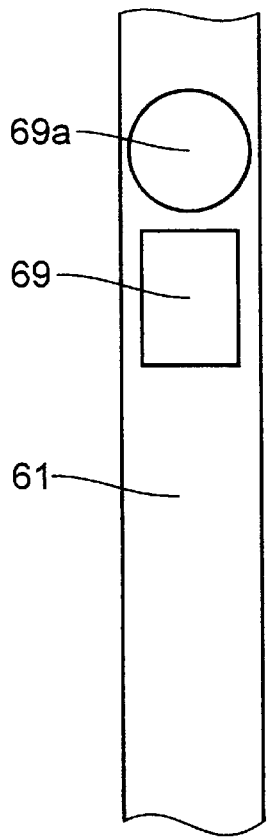
Figure 3B:
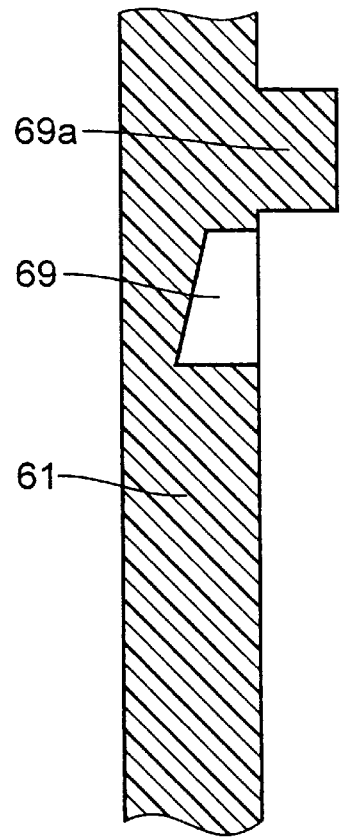
Figure 3C:
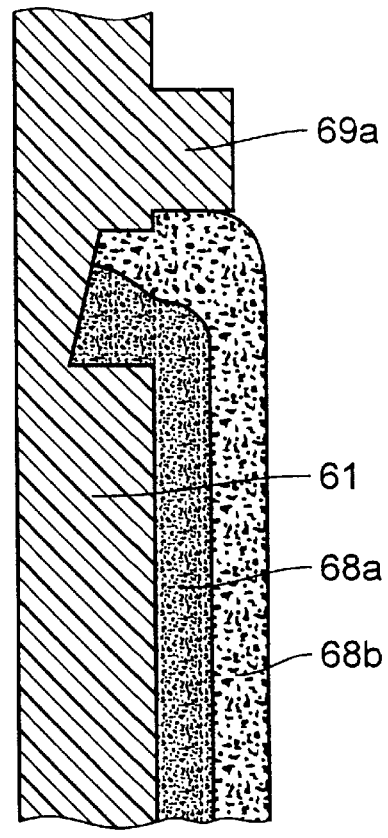
Figure 3D:
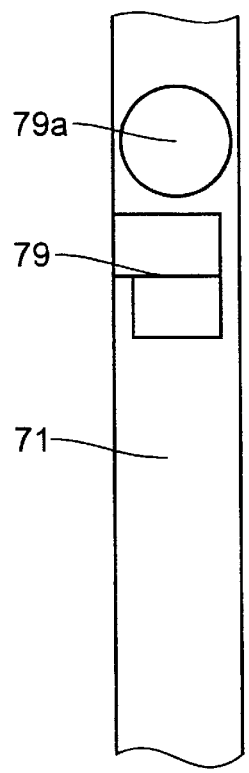
Figure 3E:
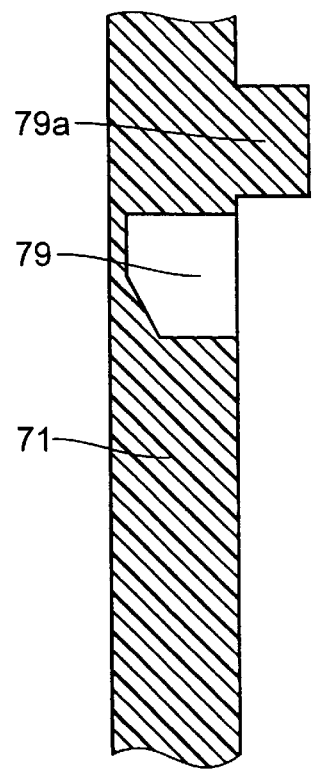
Figure 3F:
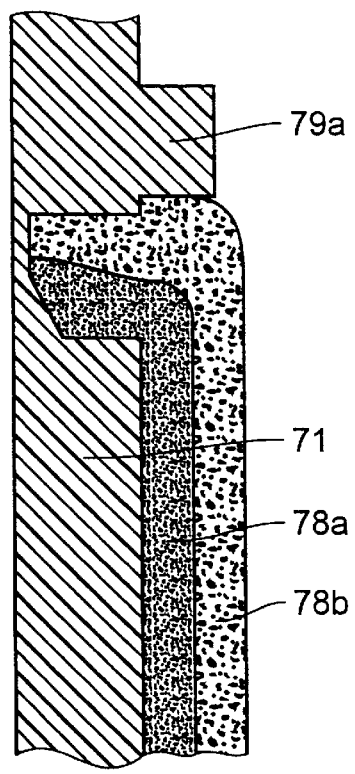
Figures 3G, 3H, 3I:
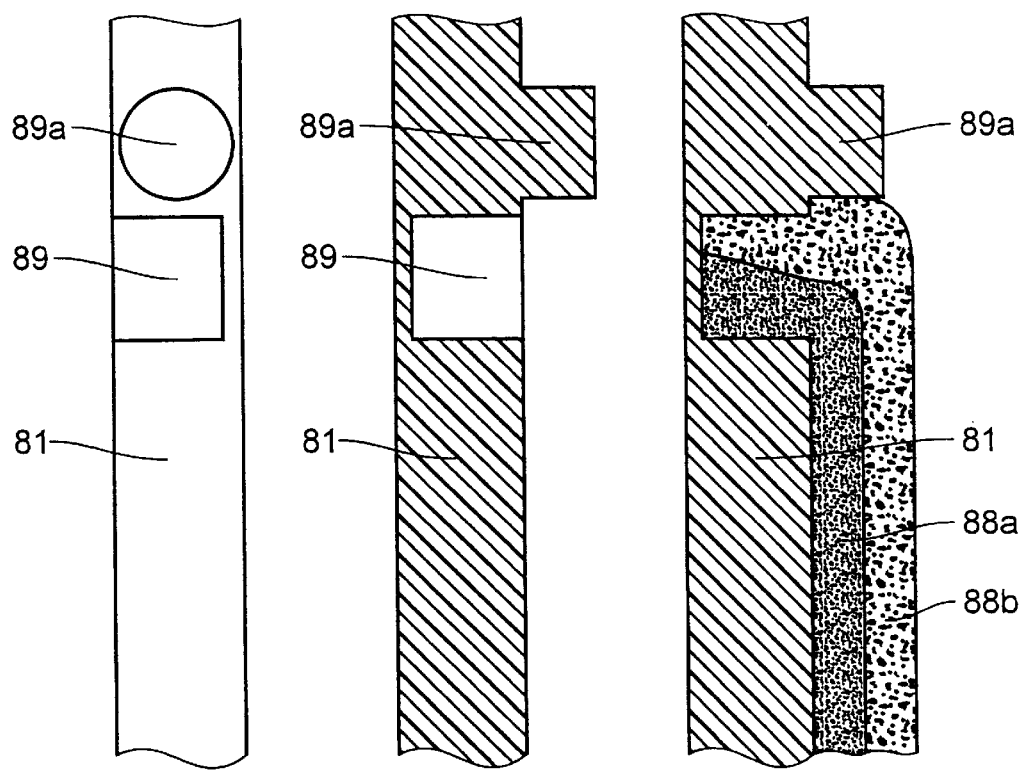

FIGS. 3a through 3i depict schematically three additional exemplary embodiments, each in a top view (FIGS. 3a, 3d, and 3g) and in a cross-sectional view (FIGS. 3b, 3e, and 3h) of a housing section 61, 71, and 81, respectively, as well as in the state with the double strand of sealing material applied 68a/68b, 78a/78b, and 88a/88b, respectively, (FIGS. 3c, 3f, and 3i). The recesses 69, 79, and 89 have a substantially rectangular cross-section here, whereby the recess 89 has one completely open side face and the recess 79 has an open side access, such that with the corresponding housing parts 81 and 71, respectively, a sealing material application can take place pivoting in from the open side into the seal path (or pivoting out from it), whereby the initial or final point is thus offset relative to the longitudinal extension of the sealing profile.

In the figures, the bottom of the recess 79 in the area of its side opening and the bottom of the recess 89 are depicted completely flat; in modified embodiments, it can, however, be designed sloping upward toward the open side in order to prevent run-out of the not yet hardened sealing material, in the event that sealing material with a relatively low viscosity is used.

The spacer (reference character 69a, 79a, or 89a) depicted in FIGS. 3a through 3i has a height of approximately 80% of the planned height of the sealing profile to limit its compression upon closing of the housing; the selection of this relationship depends, however, on the actual application, in particular on the elasticity and hardness of the sealing profile.

Figure 4A:
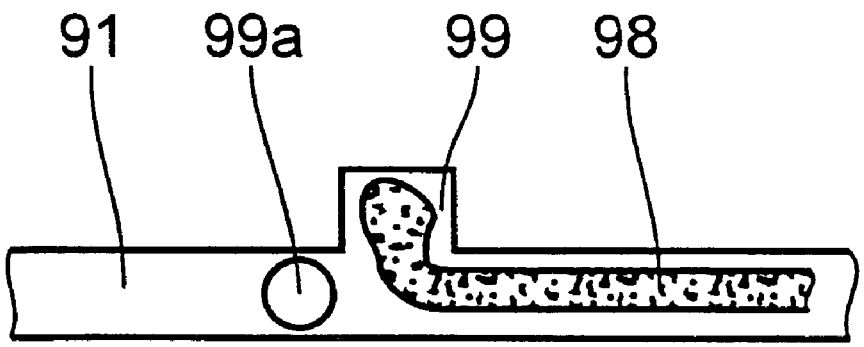
Figure 4B:
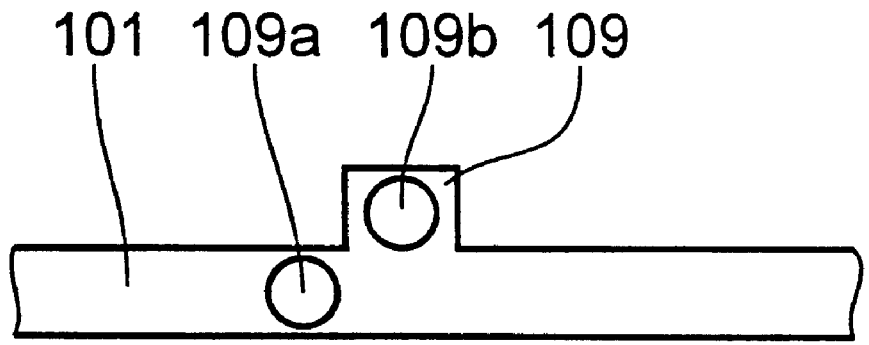

FIGS. 4a and 4b schematically depict top views of two additional embodiments of the receiving area. FIG. 4a depicts an application surface 99 formed on the side of a housing part 91 in the vicinity of a spacer 99a and somewhat lowered relative to the housing surface, which constitutes a initial point for the application of a sealing profile 98; and FIG. 4b a similar embodiment where the application surface 109 is, however, formed at the same level as the surface of the housing part 101 and also has a reservoir trough 109b.

A receiving area with the described function of evening out the profile height and thus the sealing and shielding effect over the entire path around housing edge can be embodied in extremely different shapes and can also be provided, in particular, on sealing profile bifurcation points.

For its actual shaping and dimensioning, besides the cross sectional enlargement of the profile strand to be anticipated or planned in the initial area of the dispensing procedure, the material properties of the sealing and shielding mass both in the initial pasty state (especially its running properties on the housing surface) and in the final state (especially compressibility and elasticity) must be taken into account in order to realize the ultimately critical functional aspect of a uniform sealing and shielding action over the entire course of the housing area to be sealed.

What is claimed is:

1. A housing for electromagnetically shielding electronic components, the housing comprising: a first and a second housing part and a sealing profile arranged between the first and second housing parts, the sealing profile being made of an elastically hardened sealing material dispensed along a path on the first housing part from an initial pasty state or foam, wherein the first housing part has a receiving area comprising a recess at any one or combination of initial, final and bifurcation points of the sealing profile only, for receiving an excess part of the sealing material; such that the sealing profile has an approximately even height over the path of the sealing profile with respect to the bottom of the sealing profile in an area without the recess.

2. The housing of claim 1, wherein the sealing profile is formed from an electrically conductive sealing material.

3. The housing of claim 1 or 2, wherein at least one of the first and second housing parts is made of plastic and includes a conductive coating over a surface in contact with the sealing profile.

4. The housing of claim 3, wherein the receiving area is formed on the first housing part.

5. The housing of claim 3, wherein the housing is a casting.

6. The housing of claim 3, wherein the housing is an extrusion.

7. The housing of claim 1, wherein the receiving area has an inclined surface relative to a surface of the first housing part.

8. The housing of claim 1, wherein the receiving area is formed along with an opening provided for a location of a connection means to connect the first and second housing parts.

9. The housing of claim 1, wherein the first housing part includes a retaining edge to improve adhesion of the sealing material on the surface of the first housing part at the initial point associated with the receiving area along a direction of application of the sealing material.

10. The housing of claim 1, wherein the receiving area is arranged immediately adjacent to a noncompressible spacer on a surface of the first housing part protruding toward the second housing part.

11. The housing of claim 1, wherein the initial or final point of the sealing profile and accordingly at least one section of the receiving area is arranged laterally offset relative to other parts of the path of the sealing profile.

12. A method of forming a housing including a receiving area for receipt of a sealing profile, the method comprising the steps of:

forming a first housing part;

forming a second housing part;

forming a receiving area comprising a recess, for receiving an excess part of the sealing material, integrally into at least one of the first and second housing parts at any one or combination of initial, final and bifurcation points of the sealing profile only;

applying a sealing profile to at least one of the first and second housing parts over a path such that the sealing profile has an approximately even height over the path of the sealing profile with respect to the bottom of the sealing profile in an area without the recess; and mating the first and second housing parts together.

13. The method of forming the housing of claim 12, wherein the steps of forming the first and second housing parts comprise at least one casting process.

14. The method of forming the housing of claim 12, wherein the steps of forming the first and second housing parts comprise at least one extrusion process.

* * * * *